(12) United States Patent
Tiesler et al.

(10) Patent No.: US 7,186,136 B2
(45) Date of Patent: Mar. 6, 2007

(54) FFC-CONNECTION ASSEMBLY

(75) Inventors: John M. Tiesler, Harrison Township, MI (US); Shu-Hsiung Chou, Rochester Hills, MI (US); Bret Comstock, Ypsilanti, MI (US); Ali Charara, Dearborn Heights, MI (US); Mohamad H. Zeidan, Dearborn Heights, MI (US)

(73) Assignee: Lear Corporation, Southfield, MI (US)

( * ) Notice: Subject to any disclaimer, the term of this patent is extended or adjusted under 35 U.S.C. 154(b) by 501 days.

(21) Appl. No.: 10/752,379

(22) Filed: Jan. 5, 2004

(65) Prior Publication Data

US 2005/0146214 A1     Jul. 7, 2005

(51) Int. Cl.
*H01R 12/24* (2006.01)

(52) U.S. Cl. ................ 439/493; 439/495; 439/503
(58) Field of Classification Search ........ 439/492–493, 439/502–503; 174/50.64, 117 F, 117 FF
See application file for complete search history.

(56) References Cited

U.S. PATENT DOCUMENTS

| | | | | |
|---|---|---|---|---|
| 5,176,676 A | * | 1/1993 | Kurtze | 606/32 |
| 5,219,293 A | * | 6/1993 | Imamura | 439/67 |
| 5,356,308 A | * | 10/1994 | Toba et al. | 439/495 |
| 5,357,408 A | | 10/1994 | Lecznar et al. | |
| 6,513,959 B2 | | 2/2003 | Serizawa et al. | |
| 6,786,762 B2 | * | 9/2004 | Buck et al. | 439/493 |
| 2004/0192105 A1 | * | 9/2004 | Boemmel et al. | 439/492 |

* cited by examiner

*Primary Examiner*—Michael C. Zarroli
(74) *Attorney, Agent, or Firm*—Bill Panagos

(57) ABSTRACT

An FFC-connection assembly includes an electrical component for a motor vehicle having an electrical tracing, at least one access window, a molded flange, and at least one hook. An FFC lies over the electrical tracing, mates the electrical tracing through the access window, and has a skived end at point of contact through the access window. The hook holds the FFC in place. The molded flange folds over onto the electrical component, is held down by a snap, and includes at least one depression rib so as to apply pressure against the FFC and the electrical tracing.

4 Claims, 2 Drawing Sheets

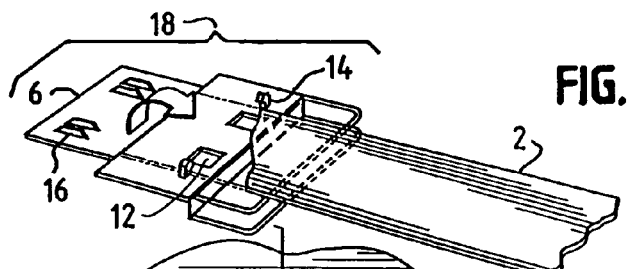
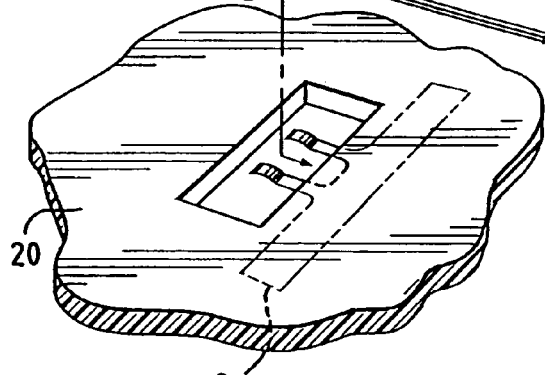
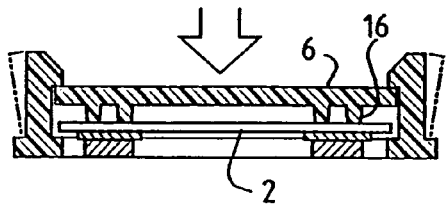
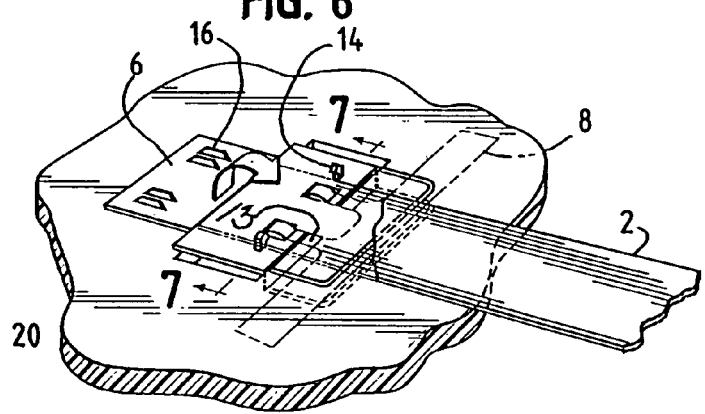
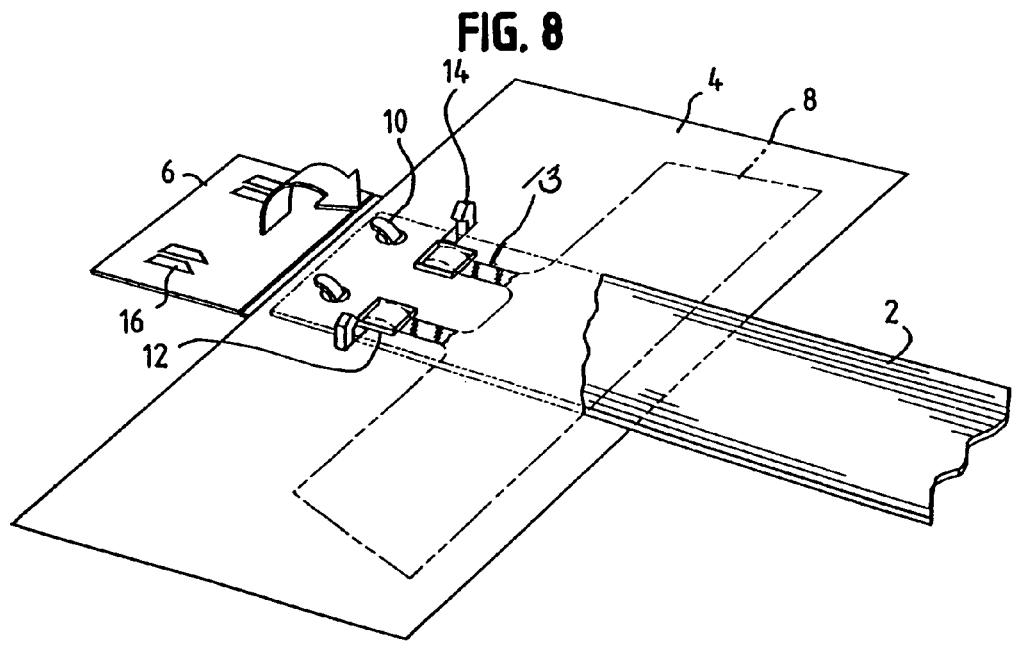

FFC-CONNECTION ASSEMBLY

FIELD OF THE INVENTION

This invention relates to wiring for electrical components in motor vehicles. More specifically, it relates to the use of flat flexible cables (hereinafter referred to as FFC) in providing the necessary electrical current for components in a motor vehicle.

BACKGROUND OF THE INVENTION

Traditionally, electrical components, such as a dome light in a motor vehicle, utilize round wires to provide the electrical connection. Currently, these components use an integrated circuit soldered to wire or have another sort of connector connected to wire in order to provide the electrical current to these features. However, this method is becoming more and more outdated as interest grows in flat flexible cables to replace the typical methods for powering components in motor vehicles.

U.S. Pat. No. 6,513,959 uses FFC's as a way of providing the necessary electrical connection for electrical equipment. However, this patent is clear in its claims that it is a "vehicle ceiling-mounting electric equipment assembly" Also, the '959 patent utilizes a different manner in making the connection between the FFC and the electrical wiring. In the '959 patent, there is a notch lie for the FFC in the wall. The FFC is passed through the notch and the distal end of the FFC is electronically connected by welding or press clamping.

Using FFC's instead of traditional components to provide an electrical connection is a more simplified and many times, a less expensive method of providing an electrical connection for motor vehicle components, such as in a dome light, window, etc. Using FFC's, as done in this invention, eliminates the need for separate connector on wire harness, reduces the time to install and secure connector to component, has an overall wire harness cost savings, and optimizes use of FFC with a trim and skived end.

SUMMARY OF THE INVENTION

This invention relates to a FFC-connection assembly comprising an electrical component for a motor vehicle and a FFC. This invention allows electrical components of a motor vehicle, such as a dome light, windows, etc. to utilize an FFC without the need for a separate wire harness or connector.

This electrical component further comprises electrical tracing, at least one access window, a molded flange, and at least one hook. The FFC lies over the electrical tracing. This FFC mates with the electrical tracing through an access window. The FFC has a skived end at the point of contact through the access window. Once the FFC is in place, a molded flange folds over onto the electrical component and is held in place over the FFC by a snap. This molded flange further comprises depression ribs so as to pressure against the FFC and the electrical tracing.

This invention also relates to a FFC-connection assembly comprising an electrical component for a motor vehicle further comprising electrical tracing, a FFC, and a remote connection location. The remote connection location clips onto the electrical component.

This remote connection location further comprises at least one access window, a molded flange, and at least one hook. The FFC lies over the electrical tracing. This FFC mates with the electrical tracing through an access window. The FFC has a skived end at the point of contact through the access window. Once the FFC is in place, a molded flange folds over onto the electrical component and is held in place over the FFC by a snap. This molded flange further comprises depression ribs so as to pressure against the FFC and the electrical tracing.

This present invention differs from known prior art in many ways. This invention can be used on a variety of electrical components, not just on vehicle ceiling mounted components. This invention can be utilized in conjunction with a power window, interior lights, or any other electrical component in a motor vehicle. Also this invention does not need to have the FFC pass through a notch nor does it need to be connected by welding to the electrical wiring. The FFC in this invention utilizes a skived end to make contact with the electrical tracing. Then the molded flange is used to further hold the FFC in place and add some pressure to ensure electrical contact.

DETAILED DESCRIPTION OF THE DRAWINGS

FIG. 5 is an exploded view of the remote location connection.

FIG. 6 is a view of the remote location connection installed to the electrical component.

FIG. 7 is a cross-sectional view of the molded flange with the depression ribs over the FFC.

FIG. 8 is a view of the FFC-connection assembly when it is integrated into the electrical component.

DETAILED DESCRIPTION OF THE PREFERRED EMBODIMENT

Figure 1:
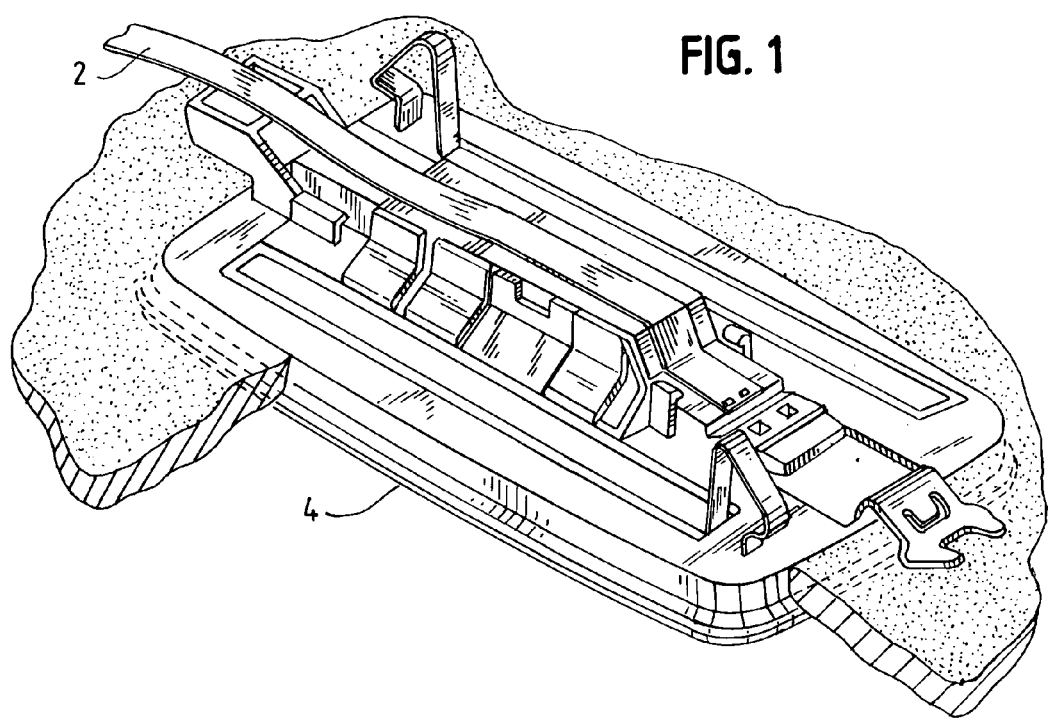
FIG. 1 depicts the FFC hooked onto the backside of the electrical component, in this case a dome lamp.
Figure 2:
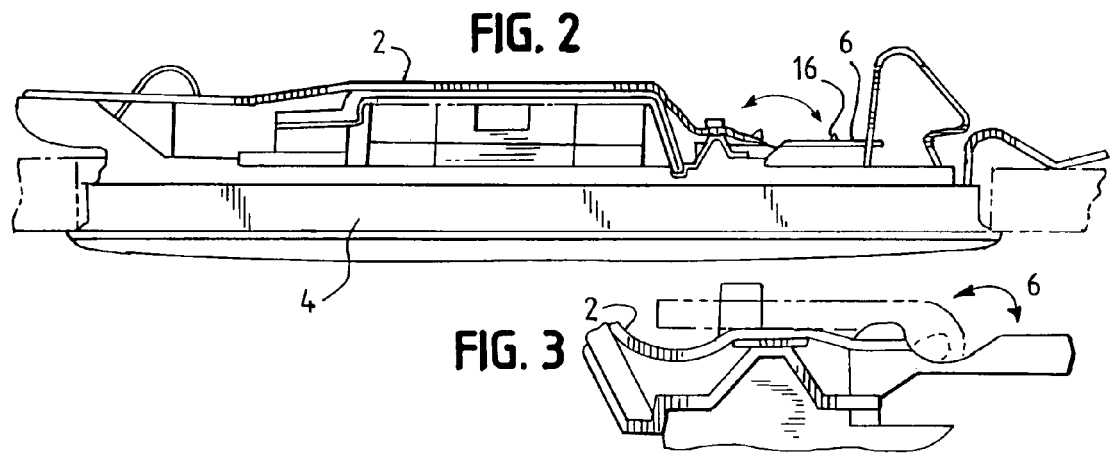
FIG. 2 depicts a side view of the electrical component, in this case a dome lamp, with the FFC hooked onto the backside with the molded flange with depression ribs open.
Figure 3:
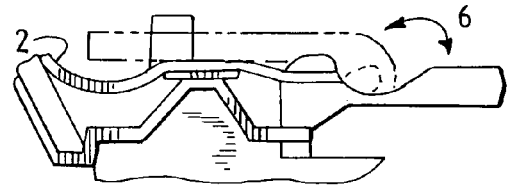
FIG. 3 is an enlarged view of the FFC and molded flange.
Figure 4:
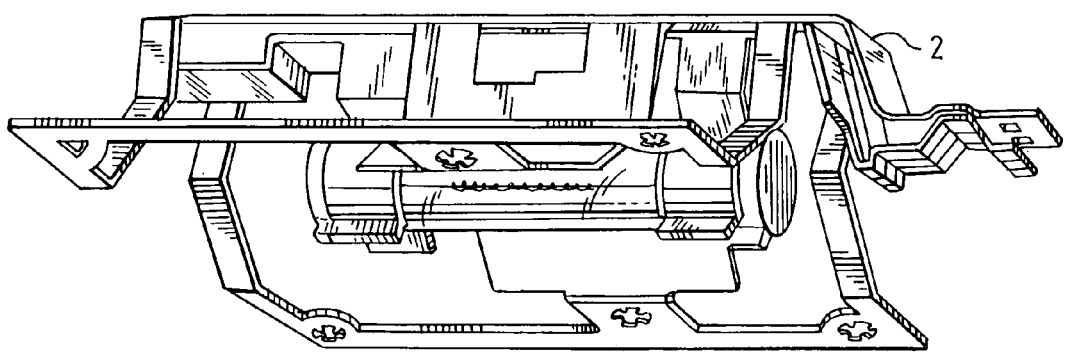
FIG. 4 is a side-underside view of the electrical component, in this case a dome lamp.

In one preferred embodiment, this FFC-connection assembly comprises an electrical component 4 for a motor vehicle and an FFC 2. This electrical component could be any electrical component in a motor vehicle, such as a power window, lights in the vehicle or even engine parts. However, this embodiment will relate to dome lamps in motor vehicle as depicted in the FIGS. as an example of how the FFC-connection assembly works.

In one of the preferred embodiments, as seen in FIG. 8, the electrical component 4 further comprises electrical tracing 8, at least one access window 12, a molded flange 6, and a hook 10. The FFC 2 lies over the electrical tracing 8. The FFC 2 then mates with the electrical tracing 8 through an access window 12. The FFC 2 has a skived end, which makes its point of contact with the electrical tracing 8. This skived end allows for the bare wires to be exposed thereby allowing for contact through the access window 12 to the electrical tracing 8.

The molded flange 6 folds over onto the electrical component 4 with the FFC 2 laid over the electrical tracing 8. This molded flange 6 is held into place by a snap 14 over it. The molded flange 6 further comprises depression ribs 16 to put added pressure on the FFC 2 against the electrical tracing 8.

In another of the preferred embodiments, as seen in FIGS. 5–7 the FFC-connection assembly comprises and electrical component 8 for a motor vehicle further comprising electrical tracing 8, a FFC 2, and a remote connection location 18. This preferred embodiment is to be used with electrical components that do not have the features for this invention integrated within the electrical component. This remote connection location 18 is clipped onto the headliner 20.

The remote connection location 18 further comprises at least one access window 12 and a molded flange 6. The FFC 2 lies over the electrical tracing 8 on the electrical component and mates with the tracing through the access window 12. The FFC 2 makes its point of contact with the electrical tracing 8 through its skived end. This skived end allows for the bare wires to be exposed thereby allowing for contact through the access window 12 to the electrical tracing 8.

The molded flange 16 folds over onto the electrical component with the FFC 2 laid over the electrical tracing 8. This molded flange 6 is held into place by a snap 14 over it. The molded flange 6 further comprises depression ribs 16 to put added pressure on the FFC 2 against the electrical tracing 8.

The above presents a description of the best mode contemplated for carrying out this invention. The claims should not be read as limited to the described order or elements unless stated to that effect. Therefore, all embodiments that come with the scope and spirit of the following claims and equivalents thereto are claimed as the invention.

What is claimed is:

1. An FFC-connection assembly comprising:
   an electrical component for a motor vehicle including an electrical tracing, at least one access window, a molded flange, and at least one hook; and
   an FFC lying over said electrical tracing, mating said electrical tracing through said access window, and having a skived end at point of contact through said access window, wherein said hooks holds said FFC in place and said molded flange folds over onto said electrical component, is held down by a snap, and includes at least one depression rib so as to apply pressure against said FFC and said electrical tracing.

2. An FFC-connection assembly comprising:
   an electrical component for a motor vehicle including an electrical tracing;
   an FFC; and
   a remote-connection assembly including at least one access window and a molded flange, wherein said FFC lies over said electrical tracing, mates said electrical tracing through said access window, and has a skived end at point of contact with said electrical tracing and said molded flange folds over onto said electrical component and is held down by a snap.

3. The FFC-connection assembly as in claim 2, wherein said remote-connection assembly clips onto a headliner of a motor vehicle.

4. The FFC-connection assembly as in claim 2, wherein, said molded flange further comprises at least one depression rib so as to apply pressure against said FFC and said electrical tracing.

* * * * *